(12) United States Patent
Hirano et al.

(10) Patent No.: US 6,486,006 B2
(45) Date of Patent: Nov. 26, 2002

(54) SEMICONDUCTOR CHIP BONDED TO A THERMAL CONDUCTIVE SHEET HAVING A FILLED THROUGH HOLE FOR ELECTRICAL CONNECTION

(75) Inventors: Koichi Hirano; Seiichi Nakatani, both of Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/927,164

(22) Filed: Aug. 10, 2001

(65) Prior Publication Data

US 2002/0028536 A1 Mar. 7, 2002

Related U.S. Application Data

(62) Division of application No. 09/158,299, filed on Sep. 22, 1998, now Pat. No. 6,300,686.

(30) Foreign Application Priority Data

Oct. 2, 1997 (JP) .............................................. 9-270006

(51) Int. Cl.⁷ ............................................... H01L 21/44
(52) U.S. Cl. ........................ 438/125; 438/106; 438/108
(58) Field of Search .................................. 436/106, 108, 436/125, 123

(56) References Cited

U.S. PATENT DOCUMENTS

| | | |
|---|---|---|
| 5,373,190 A | 12/1994 | Ichiyama |
| 5,436,503 A | 7/1995 | Kunitomo |
| 5,496,619 A | 3/1996 | Itagaki et al. |
| 5,510,956 A | 4/1996 | Suzuki |

(List continued on next page.)

FOREIGN PATENT DOCUMENTS

| | | | |
|---|---|---|---|
| EP | 446 666 | | 9/1991 |
| EP | 651 602 | | 5/1995 |
| EP | 661916 | * | 5/1995 |
| JP | 63-313846 | | 12/1988 |
| JP | 5-47958 | | 2/1993 |
| JP | 6-342794 | | 12/1994 |
| JP | 8-70081 | | 3/1996 |
| JP | 8-73621 | | 3/1996 |
| JP | 8-316361 | | 11/1996 |
| JP | 9-246318 | | 9/1997 |
| JP | 9-249765 | | 9/1997 |

OTHER PUBLICATIONS

"Solderless Assembly Method for Semiconductor Carriers"; *IBM Technical Disclosure Bulletin*, vol. 35, No. 3, pp. 130–131, Aug. 1992.

Communication from EPO and attached Search Report, Jul. 2, 1999.

*Primary Examiner*—Trung Dang
(74) *Attorney, Agent, or Firm*—Merchant & Gould PC

(57) ABSTRACT

A thermal conductive sheet including at least 70–95 weight parts of inorganic filler and 5–30 weight parts of thermosetting resin composition and having flexibility in an uncured state is prepared. Through-holes are formed in the thermal conductive sheet and a conductive resin composition is filled in the through-holes. The thermal conductive sheet and a semiconductor chip are overlapped to match positions of the through-holes formed in the thermal conductive sheet with those of the electrodes formed on the semiconductor chip. The thermal conductive sheet and the semiconductor chip are compressed while being heated and the thermal conductive sheet is cured and integrated with the semiconductor chip. An external lead electrode is formed on the thermal conductive sheet at a side opposite to the surface where the semiconductor chip is overlapped, and that is connected with the conductive resin composition. According to the above-mentioned configuration, a semiconductor package that is not required to be sealed by resin, and is excellent in reliability, air-tightness and thermal conductivity can be realized.

19 Claims, 10 Drawing Sheets

U.S. PATENT DOCUMENTS

| | | |
|---|---|---|
| 5,543,585 A | 8/1996 | Booth et al. |
| 5,554,887 A | 9/1996 | Sawai et al. |
| 5,612,569 A | 3/1997 | Murakami et al. |
| 5,622,590 A | 4/1997 | Kunitomo et al. |
| 5,652,042 A | 7/1997 | Kawakita et al. |
| 5,710,062 A | 1/1998 | Sawai et al. |
| 5,733,467 A | 3/1998 | Kawakita et al. |
| 5,834,340 A | 11/1998 | Sawai et al. |
| 5,882,459 A * | 3/1999 | Petefish et al. ............. 156/150 |
| 5,914,358 A | 6/1999 | Kawakita et al. |
| 5,977,490 A | 11/1999 | Kawakita et al. |
| 6,005,030 A | 12/1999 | Togawa et al. |
| 6,043,333 A | 3/2000 | Kuboki et al. |
| 6,046,071 A | 4/2000 | Sawai et al. |
| 6,060,150 A | 5/2000 | Nakatani et al. |
| 6,172,275 B1 | 1/2001 | Tadauchi et al. |
| 6,228,678 B1 | 5/2001 | Gilleo et al. |

\* cited by examiner (a)

(b)

(c)

(d)

(e)

(a)

(b)

(c)

SEMICONDUCTOR CHIP BONDED TO A THERMAL CONDUCTIVE SHEET HAVING A FILLED THROUGH HOLE FOR ELECTRICAL CONNECTION

FIELD OF THE INVENTION

The present invention relates to semiconductor packages used for various kinds of electric and electronic devices and a method for manufacturing the same and more particularly to a semiconductor package that is the same size as a semiconductor chip and is excellent in heat dissipation and a method for manufacturing the same.

BACKGROUND OF THE INVENTION

In recent years, integration of semiconductor chips has become denser, and the functions of semiconductor chips have become ever more advanced. Consequently, the size of semiconductor chips and the number of electrodes on the semiconductor chip have become remarkable. On the other hand, it is required for a semiconductor package to be miniaturized to meet the demand for highly efficient and miniaturized electronic devices. Under these circumstances, a semiconductor package has shifted from the QFP (Quad Flat Package) type that is a semiconductor package having leads that are arranged around the peripheral part of the package to the BGA (Ball Grid Array) type that is a semiconductor package having electrodes arranged in area array on a bottom surface and the CSP (Chip Scale Package) type that is a semiconductor package that is further miniaturized.

FIG. 10 is a cross-sectional view showing the configuration of the CSP type semiconductor package. As shown in FIG. 10, bumps 102 are formed on electrodes formed on a semiconductor chip 101, the semiconductor chip 101 having connected to electrodes 104 formed on a wiring substrate 105 with face down via conductive resin 103. Further, sealing resin 107 is filled between the semiconductor chip 101 and the wiring substrate 105 to ensure the air-tightness. In FIG. 10, numeral 106 indicates an external lead electrode.

When the CSP type semiconductor package is used, an area of a circuit board can be utilized efficiently by miniaturizing the package. Thereby the package can be suitable for high speed and low noise circuits.

However, the above-mentioned conventional CSP type semiconductor package has the following problems. That is, when reliability such as thermal shock is evaluated, a sealing part between a semiconductor chip and a wiring substrate is prone to the cracking, because the thermal expansion coefficient of the semiconductor chip and that of the wiring substrate are different, and as a result, the air-tightness might deteriorate. Further, the cost and the number of steps of manufacturing may be increased by performing a process for sealing resin and coating. Further, the thermal conductivity between the semiconductor chip and the wiring substrate is very poor and it is very difficult for heat that is generated in the semiconductor chip to be released.

SUMMARY OF THE INVENTION

The present invention aims to solve the above-mentioned subjects and provide a semiconductor package which is not required to be sealed by resin, is excellent in reliability, air-tightness and thermal conductivity, and can be manufactured at low cost easily, and a method of manufacturing the same.

To accomplish the above-mentioned object, a first configuration of a semiconductor package according to the present invention comprises a semiconductor chip, a thermal conductive mixture including at least 70–95 weight parts of inorganic filler and 5–30 weight parts of thermosetting resin composition that is bonded to an electrode surface of the semiconductor chip where electrodes are formed and to edge surfaces of the semiconductor chip that adjoin the electrode surfaces, and an external lead electrode that is formed on the thermal conductive mixture and is electrically connected with the semiconductor chip.

According to a first configuration of the semiconductor package, it is not required to provide a further resin seal for a semiconductor chip using a thermal conductive mixture as a substrate and a semiconductor package excellent in thermal conductivity can be realized. Further, the thermal expansion coefficient of a thermal conductive mixture as a substrate in the in-plane direction is almost the same as that of a semiconductor chip. Therefore even after a reflow test is conducted, an abnormality in the interface of the semiconductor chip and the package is not observed particularly, and the electrical resistance value of the semiconductor package including a part connecting the semiconductor chip and an external lead electrode changes only very slightly. As a result, a semiconductor package excellent in reliability can be realized.

In a first configuration of the semiconductor package, it is preferable that a through-hole is formed in a thermal conductive mixture opposing to an electrode formed on a semiconductor chip.

Further, in this case, it is preferable that a conductive resin composition is filled in a through-hole and an external lead electrode is connected electrically with a semiconductor chip via the conductive resin composition. In this case, it is preferable that a conductive resin composition includes at least thermosetting resin, a curing agent and at least one kind of metallic powder selected from a group consisting of gold, silver, copper, palladium and nickel.

In a first configuration of the semiconductor package, it is preferable that a bump is formed on an electrode formed on a semiconductor chip. According to this preferable example, reliability-in electrically connecting the semiconductor chip with an external lead electrode can be improved. Further, in this case, it is preferable that the bump penetrates into a thermal conductive mixture and is integrated with the external lead electrode.

In a first configuration of the semiconductor package, it is preferable that the inorganic filler includes at least one selected from a group consisting of $Al_2O_3$, MgO, BN and AlN. This is because they have high thermal conductivity.

In a first configuration of the semiconductor package, it is preferable that the inorganic filler has a particle diameter in a range between 0.1–100 μm.

In a first configuration of the semiconductor package, it is preferable that a thermosetting resin composition includes at least one kind of resin as a main component selected from a group consisting of epoxy resin, phenol resin and cyanate resin. This is because they are excellent in electric property and in mechanical property.

In a first configuration of the semiconductor package, it is preferable that a thermosetting resin composition includes brominated multi-functional epoxy resin as a main component and further includes novolak resin of bisphenol A as a curing agent and imidazole as a curing promoter.

In a first configuration of the semiconductor package, it is preferable that a thermal conductive mixture includes at least one kind selected from a group consisting of a coupling agent, a dispersing agent, a coloring agent and a mold-releasing agent.

To accomplish the above-mentioned object, a second configuration of a semiconductor package according to the present invention comprises a semiconductor chip, a thermal conductive mixture including at least 70–95 weight parts of inorganic filler and 5–30 weight parts of thermosetting resin composition that is bonded to an electrode surface of the semiconductor chip where electrodes are formed and to edge surfaces of the semiconductor chip that adjoin the electrode surface, and a wiring substrate having electrodes formed on both surfaces that is bonded to the thermal conductive mixture, and the electrodes formed on one surface of the wiring substrate are electrically connected with the semiconductor chip and the electrodes formed on another surface serve as an external electrode.

According to the second configuration of the semiconductor package, the spacing and the arrangement of the external lead electrodes can be changed by providing a wiring substrate and it becomes easy for a semiconductor package to be mounted on electronic devices.

In a second configuration of the semiconductor package, it is preferable that a main component of a wiring substrate is the same as that of a thermal conductive mixture. According to this preferable example, the thermal expansion coefficient of a peripheral part of a semiconductor becomes almost the same as that of an external lead electrode, and therefore reliability can be improved.

To accomplish the above-mentioned object, one configuration of a method for manufacturing a semiconductor package in the present invention comprises a step of overlapping a semiconductor chip on the thermal conductive sheet including at least 70–95 weight parts of inorganic filler and 5–30 weight parts of thermosetting resin composition and having flexibility in an uncured state with face down, a step of compressing the semiconductor chip and the thermal conductive sheet while being heated to bond the thermal conductive sheet to an electrode surface of the semiconductor chip where electrodes are formed and to edge surfaces of the semiconductor chip that adjoin the electrode surfaces, the thermosetting resin being cured to connect electrically an electrode formed on the semiconductor chip with an external lead electrode.

According to the method for manufacturing a semiconductor package in the present invention, a thermal conductive semiconductor package having a semiconductor chip that is mounted inside can be realized easily. This is because the thermal conductive sheet has flexibility in an uncured state, and therefore the thermal conductive sheet can be formed in a desirable shape at low temperature and at low pressure, and that a thermosetting resin composition contained in the thermal conductive sheet can be cured with pressure while being heated, and therefore a rigid substrate can be formed of the thermal conductive sheet.

In the method for manufacturing a semiconductor package in the present invention, it is preferable that the temperature in a process for heat-pressing is in a range between 170–260° C. This is because when the temperature is too low, a thermosetting resin composition is not cured sufficiently, and when the temperature is too high, the thermosetting resin composition starts to decompose.

In the method for manufacturing a semiconductor package in the present invention, it is preferable that the pressure in a process for heat-pressing is in a range between 1–20 MPa. This is because when the pressure is too low, it becomes difficult for a thermal conductive sheet to be bonded to an electrode surface of a semiconductor chip where electrodes are formed and to edge surfaces of the semiconductor chip that adjoin the electrode surface, and when the pressure is too high, a semiconductor chip is prone to the damage.

In the method for manufacturing a semiconductor package in the present invention, it is preferable that prior to a step of overlapping a semiconductor chip on a thermal conductive sheet with face down, a step of forming a through-hole in the thermal conductive sheet opposing to an electrode formed on the semiconductor chip is further included. According to this preferable example, when a bump is formed on an electrode formed in a semiconductor chip, it becomes easier to match a position of the semiconductor chip with that of the thermal conductive sheet. Further, in this case, it is preferable that a through-hole is formed by laser processing, drilling or punching. Further, in this case, it is preferable that after a through-hole is formed, a step of filling a thermosetting resin composition in the through-hole is further included. In this case, it is preferable that in a process for filling a conductive resin composition in a through-hole, the conductive resin composition is filled in only one part of the through-hole facing an opening and is not filled in another part of the through-hole facing another side. According to this preferable example, in integrating a semiconductor chip with a thermal conductive sheet, short circuit and disconnection caused by flowing out of excess conductive resin composition can be prevented. Further, as there is an opening at one side of the penetration, in overlapping a semiconductor chip having a bump formed on an electrode on a thermal conductive sheet, though there is a conductive resin composition, it becomes easier to match a position of the semiconductor chip with that of the thermal conductive sheet. In this case, it is preferable that a thermosetting resin composition includes at least one kind of metallic powder selected from a group consisting of gold, silver, copper, palladium and nickel, thermosetting resin and a curing agent.

In the method for manufacturing a semiconductor package in the present invention, it is preferable that after a plurality of semiconductor chips are overlapped on a thermal conductive sheet with face down and the plurality of semiconductor chips and external lead electrodes are formed integrally, the plurality of semiconductor chips, the thermal conductive sheet and the external lead electrodes that are formed integrally are divided into individual semiconductor packages. According to this preferable example, many semiconductor packages can be obtained with one operation.

In the method for manufacturing a semiconductor package in the present invention, it is preferable that after a bump is formed on an electrode formed on a semiconductor chip, the semiconductor chip is overlapped on a thermal conductive sheet with face down. Further, in this case, it is preferable that a bump is penetrated into a thermal conductive sheet to connect with an external lead electrode.

In the method for manufacturing a semiconductor package in the present invention, it is preferable that after metallic foil is overlapped on a surface of a thermal conductive sheet that is opposite to a surface on which a semiconductor chip is overlapped and integrated, the metallic foil is patterned in a desirable shape to form an external lead electrode.

In the method for manufacturing a semiconductor package in the present invention, it is preferable that an electrode pattern that is patterned in a desirable shape is transferred to a surface of a thermal conductive sheet at a side opposite to the surface on which a semiconductor chip is overlapped to form an external lead electrode.

In the method for manufacturing a semiconductor package in the present invention, it is preferable that a wiring substrate whose surface is patterned in a desirable electrode shape is bonded to a surface of a thermal conductive sheet at a side opposite to the surface on which a semiconductor chip is overlapped is integrated with the thermal conductive sheet to form an external lead electrode.

In the method for manufacturing a semiconductor package in the present invention, it is preferable that the inorganic filler includes at least one selected from a group consisting of $Al_2O_3$, MgO, BN and AlN.

In the method for manufacturing a semiconductor package in the present invention, it is preferable that the inorganic filler has a particle diameter in a range between 0.1–100 $\mu$m.

In the method for manufacturing a semiconductor package in the present invention, it is preferable that a thermosetting resin composition includes at least one kind of resin as a main component selected from a group consisting of epoxy resin, phenol resin and cyanate resin.

In the method for manufacturing a semiconductor package in the present invention, it is preferable that a thermosetting resin composition includes brominated multifunctional epoxy resin as a main component and further includes novolak resin of bisphenol A as a curing agent and imidazole as a curing promoter.

In the method for manufacturing a semiconductor package in the present invention, it is preferable that a thermal conductive sheet includes at least one kind selected from a group consisting of a coupling agent, a dispersing agent, a coloring agent and a mold-releasing agent.

DETAILED DESCRIPTION OF THE PREFERRED EMBODIMENT

Figure 1:
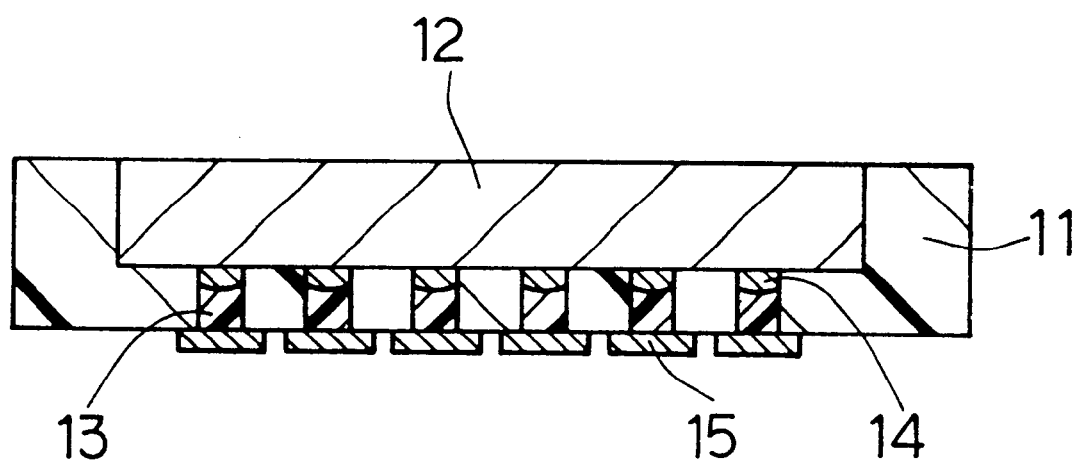
FIG. 1 is a cross-sectional view showing the configuration of a semiconductor package of the present invention.

In the present invention, a thermal conductive sheet comprising a thermosetting resin composition in which inorganic filler is filled with high density, having about the same thermal expansion coefficient in in-plane as of a semiconductor chip, and having high thermal conductivity and flexibility in an uncured state, is a main component. The thermal conductive sheet can be formed in a desirable shape at low temperature and low pressure, because the thermal conductive sheet has flexibility in the uncured state. Further, a substrate made of the thermal conductive sheet is rigid, because the thermosetting resin composition contained in the thermal conductive sheet is cured by being compressed while being heated. Accordingly, a thermal conductive semiconductor package having a semiconductor chip mounted therein can be realized readily by using the thermal conductive sheet.

A first embodiment of the present invention is as follows. That is, through-holes are formed in the thermal conductive sheet opposing to electrodes formed on a semiconductor chip, a conductive resin composition is filled in the through-holes, the thermal conductive sheet and the semiconductor chip are overlapped to match positions of through-holes formed in the thermal conductive sheet with those of the electrodes formed on the semiconductor chip, and is compressed- while being heated. As a result, the thermal conductive sheet is cured and integrated with the semiconductor chip, and the semiconductor chip is integrated with external lead electrodes. According to the first embodiment of the present invention, a semiconductor chip can be mounted on a substrate directly, and a semiconductor package excellent in heat dissipation can be realized.

A second embodiment of the present invention is as follows. That is, a semiconductor chip having bumps is overlapped on the thermal conductive sheet with face down, and is compressed while being heated. As a result, the thermal conductive sheet is cured and integrated with the semiconductor chip, and the bumps penetrate into the thermal conductive sheet and are integrated with external lead electrodes.

A third embodiment of the present invention is as follows. That is, through-holes are formed in the thermal conductive sheet, the thermal conductive sheet and a semiconductor chip having bumps are overlapped to match positions of the through-holes formed in the thermal conductive sheet with those of the bumps formed on the semiconductor chip, and are compressed while being heated. As a result, the thermal conductive sheet is cured and integrated with the semiconductor chip, and the bumps penetrate into the through-holes formed in the thermal conductive sheet and are integrated with external lead electrodes.

A fourth embodiment of the present invention is as follows. That is, the thermal conductive sheet and a semiconductor chip are overlapped and compressed while being heated. As a result, the thermal conductive sheet is cured and integrated with a semiconductor chip. A wiring substrate having electrodes formed on an outermost layer, which was formed beforehand, is integrated with the thermal conductive sheet to form external lead electrodes. In the fourth embodiment, the thermal conductive sheet can be integrated with a semiconductor chip by using a method explained in the above-mentioned first, second and third embodiments.

Hereinafter, more details will be explained referring to embodiments of the present invention.

FIG. 1 is a cross-sectional view showing the configuration of a semiconductor package in the present invention. As shown in FIG. 1, a thermal conductive mixture 11 including at least inorganic filler and a thermosetting resin composition is bonded to an electrode surface of a semiconductor chip 12 where electrodes are formed and to edge surfaces of the semiconductor chip that adjoin the electrode surface and is integrated with the semiconductor chip 12. Bumps 14 are formed on the electrodes formed on the semiconductor chip 12 and the bumps 14 connect with external lead electrodes 15 via a conductive resin composition 13.

Figure 2:
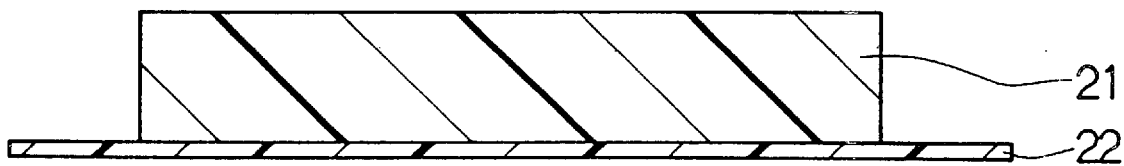
FIG. 2 is a cross-sectional view showing a thermal conductive sheet as a basic component of a semiconductor package of the present invention.

FIG. 2 is a cross-sectional view showing a thermal conductive sheet as a basic component of semiconductor package in the present invention. As shown in FIG. 2, a thermal conductive sheet 21 is formed on a mold-releasing film 22. In this case, first, a mixture slurry including at least inorganic filler, a thermosetting resin composition, a solvent having a boiling point of 150° C. or higher and a solvent having a boiling point of 100° C. or lower is prepared, and a film of the mixture slurry is formed on the mold-releasing film 22. It is not limited to this method for forming a film and other methods such as a doctor blade method, a coater method, and an extrusion molding method can be employed. Next, only the solvent having a boiling point of 100° C. or less contained in the mixture slurry formed on the mold-releasing film 22 is vaporized. Accordingly, the thermal conducive sheet 21 that is an uncured state and having flexibility is obtained. An epoxy resin, a phenol resin or a cyanate resin can be used as a main component of the thermosetting resin composition. It is especially preferable that brominated epoxy resin is used, because the brominated epoxy resin has flame resistance. Novolak resin of bisphenol A can be used as a curing agent contained in the thermosetting resin composition. Imidazole can be used as a curing promoter.

It is preferable that a filling ratio of inorganic filler in a thermal conductive sheet and a thermal conductive mixture that is a post-thermally cured thermal conductive sheet is 70–95 weight parts, more preferably 85–95 weight parts. When a filling ratio of inorganic filler is lower than 70 weight parts, thermal conductivity lowers and when a filling ratio of inorganic filler is higher than 95 weight parts, the amount of the thermosetting resin composition, which gives flexibility to the thermal conductive sheet decreases, and consequently formability of the thermal conductive sheet deteriorates. The filling ratio of the inorganic filler is calculated in the composition which does not comprise a solvent having a boiling point of 100° C. or lower. $Al_2O_3$, MgO, BN and AlN can be used as inorganic filler, because they have high thermal conductivity and can be used preferably. It is preferable that the inorganic filler has a particle diameter from 0.1 to 100 $\mu$m. When the particle diameter of the inorganic filler is too small or too large, the filling ratio of the inorganic filler decreases, thermal conductivity of the thermal conductive sheet deteriorates, the difference between thermal expansion coefficient of the thermal conductive sheet and that of semiconductor chip increases, and therefore, the thermal conductive sheet becomes unsuitable for a semiconductor package. Ethyl carbitol, butyl carbitol, and butyl carbitol acetate can be used as a solvent having a boiling point of 150° C. or higher. Methyl ethyl ketone, isopropanol or toluene can be used as a solvent having a boiling point of 100° C. or lower. If needed, a coupling agent, a dispersing agent, a coloring agent and a mold-releasing agent may be added to the composition contained in a thermal conductive sheet.

Further, in the above-mentioned mixture slurry, a solvent having a boiling point of 150° C. or higher and a solvent having a boiling point of 100° C. or lower are contained, however, the solvents may not always be included, if the thermal conductive sheet has flexibility when the thermosetting resin composition is an uncured state. In a thermal conductive mixture that is a post-cured thermal conductive sheet, inorganic filler can be filled with high density. When the thermal conductive mixture is used, a semiconductor package that has almost the same thermal expansion coefficient as that of semiconductor chip and that is excellent in heat dissipation can be realized.

Next, a method for manufacturing a semiconductor package having the above-mentioned configuration will be explained.

Figure 3:
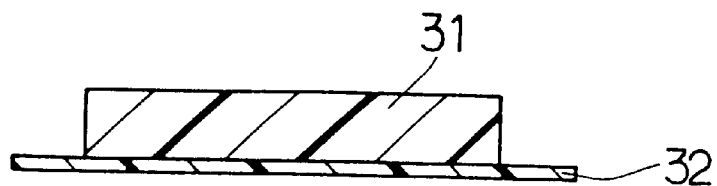
FIGS. 3(a)–(e) are cross-sectional views showing a process for manufacturing a semiconductor package of the present invention.
Figure 3:
Figure 3:
Figure 3:
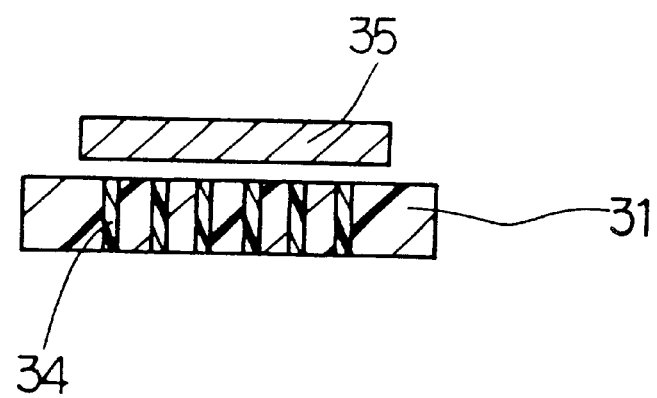
Figure 3:
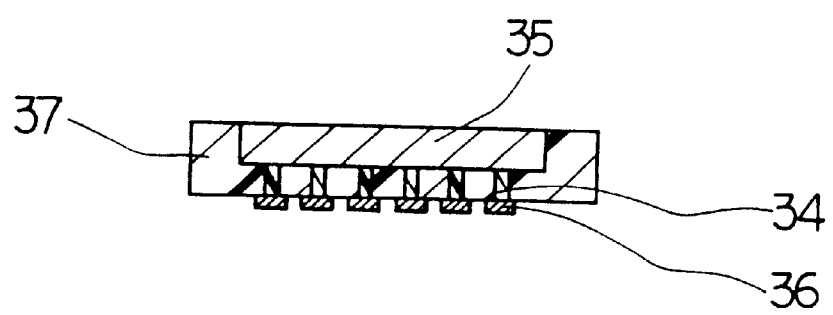

FIGS. 3(a)–(e) are cross-sectional views showing a process for manufacturing a semiconductor package in the present invention. First, as shown in FIG. 3(a), a thermal conductive sheet 31 is formed on a mold-releasing film 32 as above-mentioned (refer to FIG. 2 and the explanation thereof). Next, as shown in FIG. 3(b), through-holes 33 are formed in the mold-releasing film 32 and the thermal conductive sheet 31. The through-hole 33 may be formed by laser processing with carbon dioxide laser or excimer laser, by drilling or by punching. Particularly, the laser processing is preferable because the laser processing can be conducted readily and with high accuracy. Next, as shown in FIG. 3(c), a conductive resin composition 34 is filled in the through-holes 33. Conductive paste that is a mixture including metallic powder, thermosetting resin and a curing agent for resin can be used as the conductive resin composition 34. Gold, silver, copper palladium or nickel can be used as metallic powder, because they are preferable in electrical resistance value and reliability. Epoxy resin can be used as the thermosetting resin, and imidazole can be used as a curing agent for resin. Next, as shown in FIG. 3(d), after the mold-releasing film 32 is peeled from the thermal conductive sheet 31, the thermal conductive sheet 31 and a semiconductor chip 35 are overlapped to match positions of the through-holes 33 formed in the thermal conductive sheet 31 with those of electrodes formed on the semiconductor chip 35. Next, as shown in FIG. 3 (e), the thermal conductive sheet 31 and the semiconductor chip 35 are compressed While being heated and the thermal conductive sheet 31 is cured and integrated with the semiconductor chip 35. A process for heat-pressing is conducted by using a die, and the thermosetting resin composition contained in the thermal conductive sheet 31 softens once and then cures. Consequently, a thermal conductive mixture 37 that is the post-cured thermal conductive sheet 31 is bonded to an electrode surface of the semiconductor chip 35 where electrodes are formed and to edge surfaces of the semiconductor chip that adjoin the electrode surface. As a result, a creepage distance from outward to electrodes formed on the semiconductor chip 35 becomes large and an influence of moisture adsorption and so on decreases. Finally, external lead electrodes 36 that connect with the thermosetting resin composition 34 are formed at a side of the thermal conductive mixture 37 that is opposite to a side of the semiconductor chip 35. Screen printing method, transcription or etching can be employed as a method for forming the external lead electrode 36. Particularly, the etching and the transcription are preferable because the external lead electrode 36 is integrated with the thermal conductive mixture 37. According to the above-mentioned procedures, a semiconductor package is obtained.

Figure 4:
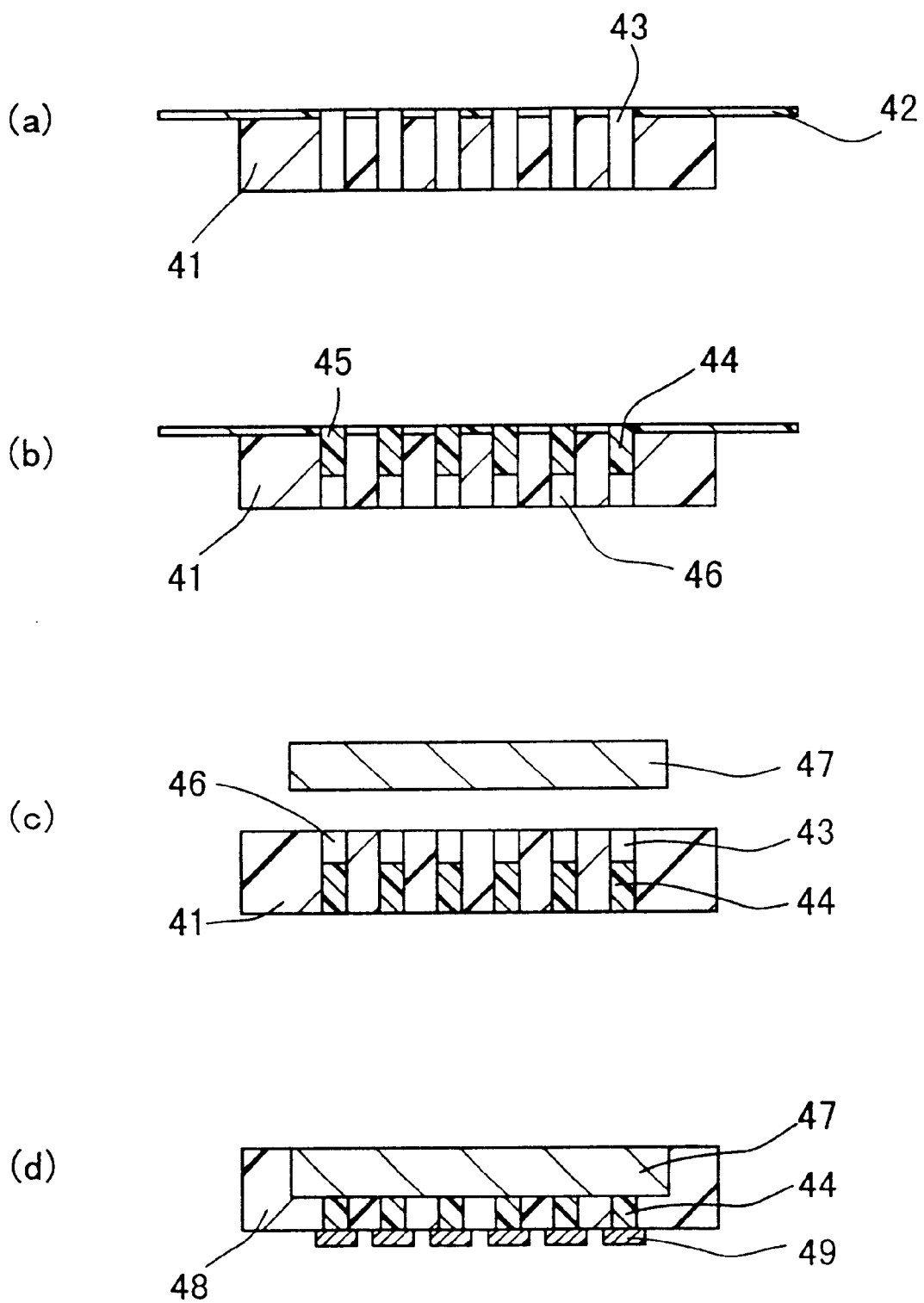
FIGS. 4(a)–(d) are cross-sectional views showing another process for manufacturing a semiconductor package of the present invention.

FIGS. 4(a)–(d) are cross-sectional views showing another process for manufacturing a semiconductor package in the present invention. FIG. 4 (a) shows a thermal conductive sheet 41 in which through-holes 43 are formed by the same procedure as those of FIGS. 3(a) and (b). In FIG. 4(a), numeral 42 indicates a mold-releasing film.

As shown in FIG. 4(b), a conductive resin composition 44 is filled in the through-holes 43. In this case, only the part facing an opening 45 of the through-hole 43 is filled with the conductive resin composition 44 and the part facing an opening 46 of the through-hole 43 is not filled with the conductive resin composition 44.

Next, as shown in FIG. 4(c), the thermal conductive sheet 41 and a semiconductor chip 47 are overlapped so as that a surface of the thermal conductive sheet 41 having an opening 46 where the conductive resin composition 44 is not filled in the through-hole 43 faces a surface of electrodes formed on the semiconductor chip 47, and are overlapped to match positions of the through-holes 43 with those of the electrodes formed on the semiconductor chip 47.

Next, as shown in FIG. 4(d), the thermal conductive sheet 41 and the semiconductor chip 47 are compressed while being heated and the thermal conductive sheet 41 is cured and integrated with the semiconductor chip 47. A process for heat-pressing is conducted by using a die, and the thermosetting resin composition contained in the thermal conductive sheet 41 softens once and then cures. Consequently, a thermal conductive mixture 48 that is the post-cured thermal conductive sheet 41 is bonded to an electrode surface of the semiconductor chip 47 where electrodes are formed and to edge surfaces of the semiconductor chip that adjoin the electrode surface.

Finally, external lead electrodes 49 that connect with the conductive resin composition 44 are formed at a side of the thermal conductive mixture 48 that is opposite to a side of the semiconductor chip 47. According to the above-mentioned procedures, a semiconductor package is obtained. In this case, at a side of the thermal conductive sheet 41 facing the semiconductor chip 47, the conductive resin composition 44 is not present. Therefore, even if the thermal conductive sheet 41 flows while embedding the semiconductor chip 47, the conductive resin composition 44 that connects electrically with the semiconductor chip 47 does not flow. As a result, short circuits can be avoided. Further, when bumps are formed on electrodes formed on the semiconductor chip 47, it becomes to be easier to match a position of the thermal conductive sheet 41 with that of the semiconductor chip 47 by matching positions of the bumps and those of the though-holes 43.

Figure 5:
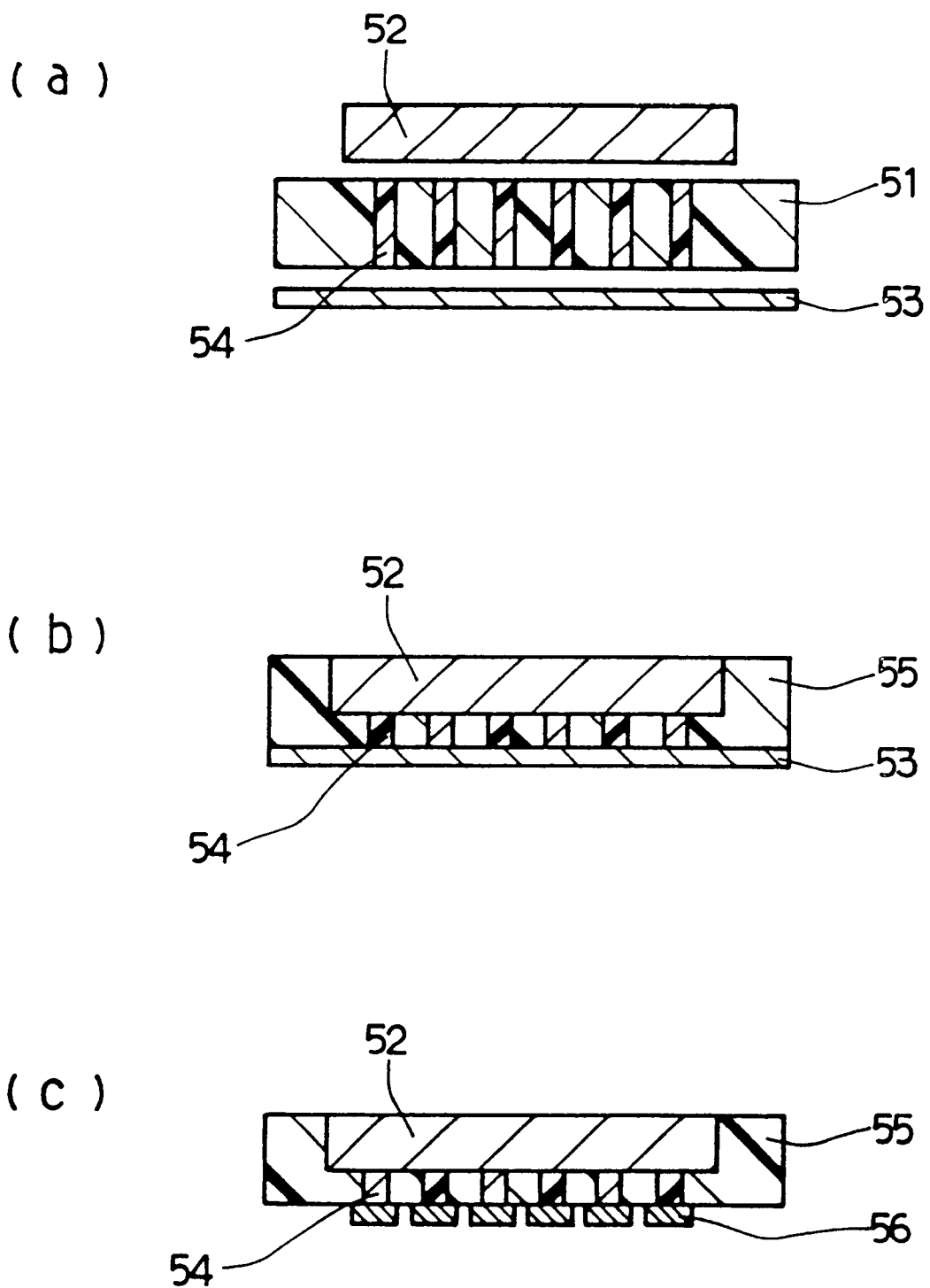
FIGS. 5(a)–(c) are cross-sectional views showing a process for forming an external lead electrode by etching.

Next, a method for forming an external lead electrode will be explained. FIGS. 5(a)–(c) are cross-sectional views showing a process for forming an external lead electrode by etching. First, as shown in FIG. 5(a), through-holes are formed in a thermal conductive sheet 51, and a conductive resin composition 54 is filled in the through holes. A semiconductor chip 52 is overlapped on a top surface and metallic foil 53 is overlapped on a bottom surface of the thermal conductive sheet 51, respectively. Copper foil can be used as metallic foil 53. Next, as shown in FIG. 5(b), the thermal conductive sheet 51, the semiconductor chip 52 and the metallic foil 53 are compressed while being heated and the thermal conductive sheet 51 is cured and integrated with the semiconductor chip 52 and the metallic foil 53. A process for heat-pressing is conducted by using a die, and the thermosetting resin composition contained in the thermal conductive sheet 51 softens once and then cures. Consequently, a thermal conductive mixture 55 that is the post-cured thermal conductive sheet 51 is bonded to an electrode surface of the semiconductor chip 52 where electrodes are formed and to edge surfaces of the semiconductor chip that adjoin the electrode surface, and the metallic foil 53 is bonded to a surface of the thermal conductive mixture 55 that is opposite to a side of the semiconductor chip 52. Next, as shown in FIG. 5(c), metallic foil 53 is patterned by etching to form external lead electrodes 56. According to the above-mentioned procedures, the external lead electrodes 56 are formed integrally with the thermal conductive mixture 55. In general, wet-etching, in which ferric chloride is used as the etching solution is employed as etching. Further, if needed, nickel or gold may be plated on the external lead electrodes. In addition, an external lead electrode may be formed of a solder ball.

Figure 6:
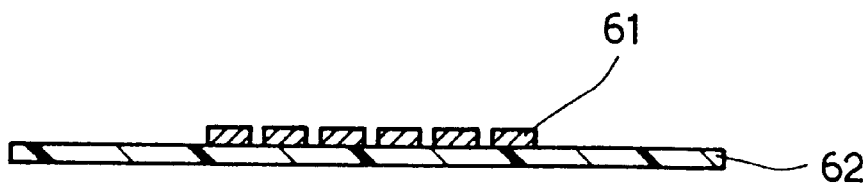
FIGS. 6(a)–(c) are cross-sectional views showing a process for forming an external lead electrode by transcription.
Figure 6:
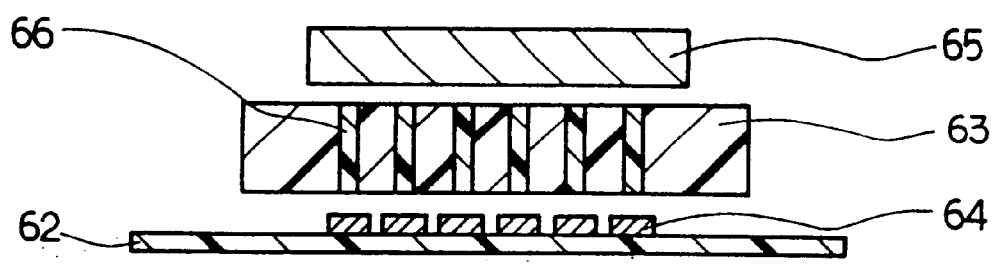
Figure 6:
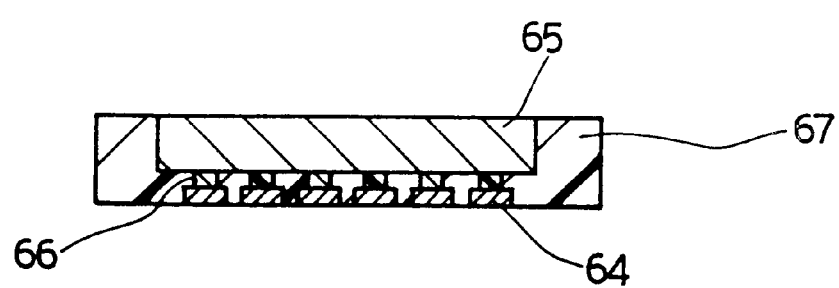

FIGS. 6(a)–(c) are cross-sectional views showing a process for forming an external lead electrode by transcription. First, as shown in FIG. 6(a), metallic foil 61 is formed on a base film 62 and patterned to form an electrode pattern 64. Copper foil can be used as metallic foil. Next, as shown in FIG. 6(b), a semiconductor chip 65 is overlapped on one surface of a thermal conductive sheet 63 having through-holes in which conductive resin composition 66 is filled and the electrode pattern 64 shown in FIG. 6(a) is overlapped on another surface of the thermal conductive sheet 63. Next, as shown in FIG. 6(c), the semiconductor chip 65, the thermal conductive sheet 63 and the electrode pattern 64 are compressed while being heated and the thermal conductive sheet 63 is cured and integrated with the semiconductor chip 65 and the electrode pattern 64. A process for heat-pressing is conducted by using a die, and the thermosetting resin composition contained in the thermal conductive sheet 63 softens once and then cures. Consequently, a thermal conductive mixture 67 that is the post-cured thermal conductive sheet 63 is bonded to an electrode surface of the semiconductor chip 65 where electrodes are formed and to edge surfaces of the semiconductor chip that adjoin the electrode surface, and the electrode pattern 64 is bonded to a surface of the thermal conductive mixture 67 that is opposite to a side of the semiconductor chip 65. Finally, the base film 62 is peeled from the electrode pattern 64. According to the above-mentioned procedures, the electrode pattern 64 is formed integrally with the thermal-conductive mixture 67 as external lead electrodes.

Figure 7:
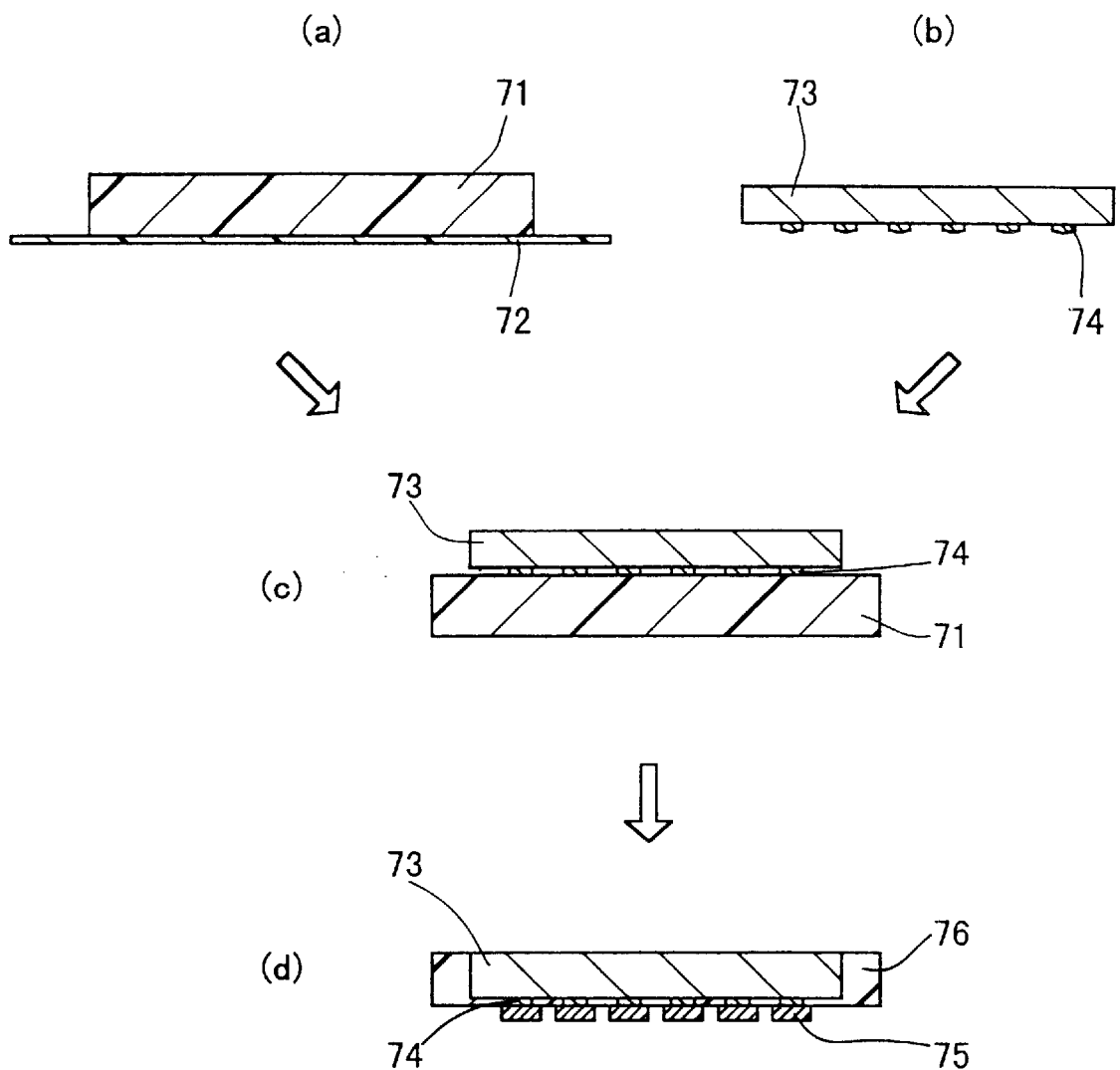
FIGS. 7(a)–(d) are cross-sectional views showing another process for manufacturing a semiconductor package of the present invention.

FIGS. 7(a)–(d) are cross-sectional views showing another process for manufacturing a semiconductor package in the present invention. First, as shown in FIG. 7(a), a thermal conductive sheet 71 is formed on a mold-releasing film 72 as above-mentioned (refer to FIG. 2 and the explanation thereof). Next, as shown in FIG. 7(b), a semiconductor-chip 73 having bumps 74 formed on electrodes is prepared. Gold or aluminum may be bonded to an electrode according to the disclosed method and can be used as a bump. Further, a solder ball that is formed on an electrode can be used as a bump. Next, as shown in FIG. 7(c), the mold-releasing film 72 is peeled from the thermal conductive sheet 71, and the semiconductor chip 73 having bumps 74 formed on electrodes is overlapped on the thermal conductive sheet 71 with face down. Next, as shown in FIG. 7(d), the thermal conductive sheet 71 and the semiconductor chip 73 are compressed while being heated and the thermal conductive sheet 71 is cured and integrated with the semiconductor chip 73. A process for heat-pressing is conducted by using a die, and the thermosetting resin composition contained in the thermal conductive sheet 71 softens once and then cures. Consequently, a thermal conductive mixture 76 that is the post-cured thermal conductive sheet 71 is bonded to an electrode surface of the semiconductor chip 73 where electrodes are formed and to edge surfaces of the semiconductor chip that adjoin the electrode surface. Further, in this case, the bumps 74 formed on the semiconductor ship 73 penetrated into the thermal conductive sheet 71 and are exposed to the back side of the thermal conductive sheet 71 (that is, the thermal conductive mixture 76).

Finally, external lead electrodes 75 that connect with the bump 74 formed on the semiconductor chip 73 are formed on the rear face of the thermal conductive mixture 76. According to the above-mentioned procedures, a semiconductor package is obtained. Further, a method for forming the external lead electrode 75 is same as that above-mentioned. According to this method for forming a semiconductor package, a process for forming through-holes and that for filling a conductive resin composition in the through-holes can be omitted, and thereby productivity improves. Further, in this case, the external lead electrode 75 connects with the semiconductor chip 73 directly, that is, without a conductive resin composition, and electrical resistance between the external lead electrode 75 and the semiconductor chip 73 lowers.

Figure 8:
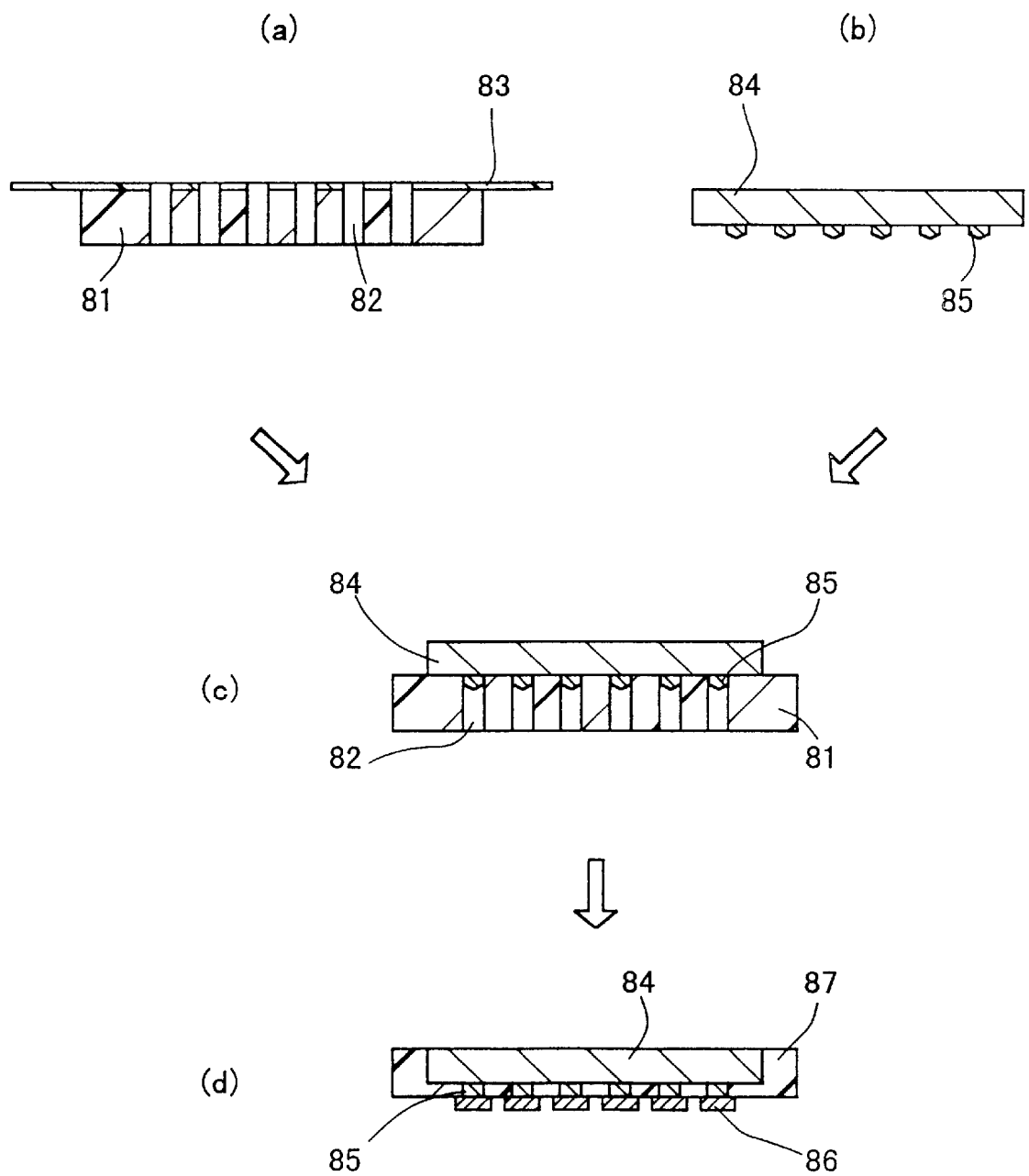
FIGS. 8(a)–(d) are cross-sectional views showing another process for manufacturing a semiconductor package of the present invention.

FIGS. 8(a)–(d) are cross-sectional views showing another process for manufacturing a semiconductor package in the present invention. First, as shown in FIG. 8(a), a thermal conductive sheet 81 is formed on a mold-releasing film 83 as above-mentioned (refer to FIG. 2 and the explanation thereof and through-holes 82 are formed in the mold-releasing film 83 and the thermal conductive sheet 81. Next, as shown in FIG. 8(b), a semiconductor chip 84 having bumps 85 formed on electrodes is prepared. Next, as shown in FIG. 8(c), the mold-releasing film 83 is peeled from the thermal conductive sheet 81, and the semiconductor chip 84 and the thermal conductive sheet 81 are overlapped to match positions of the through-holes formed in the thermal conductive sheet 81 with those of the bumps 85 formed on the semiconductor chip 84. Next, as shown in FIG. 8(d), the thermal conductive sheet 81 and the semiconductor chip 85 are compressed while being heated and the thermal conductive sheet 81 is cured and integrated with the semiconductor chip 85. A process for heat-pressing is conducted by using a die, and the thermosetting resin composition contained in the thermal conductive sheet 81 softens once and then cures. Consequently, a thermal conductive mixture 87 that is the post-cured thermal conductive sheet 81 is bonded to an electrode surface of the semiconductor chip 84 where electrodes are formed and to edge surfaces of the semiconductor chip that adjoin the electrode surface. In this case, the bumps 85 formed on the semiconductor chip 84 penetrate into the through-holes 82 and are exposed to the back side of the thermal conductive sheet 81 (that is, the thermal conductive mixture 87). Finally, external lead electrodes 86 that connect with the bumps 85 formed on the semiconductor chip 84 are formed on the rear face of the thermal conductive mixture 87. According to the above-mentioned procedures, a semiconductor package is obtained. According to the above-mentioned method for manufacturing a semiconductor package, a step of filling a conductive resin composition in the through-holes 82 can be omitted, and thereby productivity improves. Further, it becomes easier to match a position of the thermal conductive sheet 81 with that of the semiconductor chip 84, because through-holes 82 are formed in the thermal conductive sheet 81 and bumps 85 are formed on the semiconductor chip 84. Further, a thermal conductive sheet 81 and a semiconductor chip 84 may be positioned and overlapped after a conductive resin composition is filled in the through-holes 82 and be formed integrally.

Figure 9:
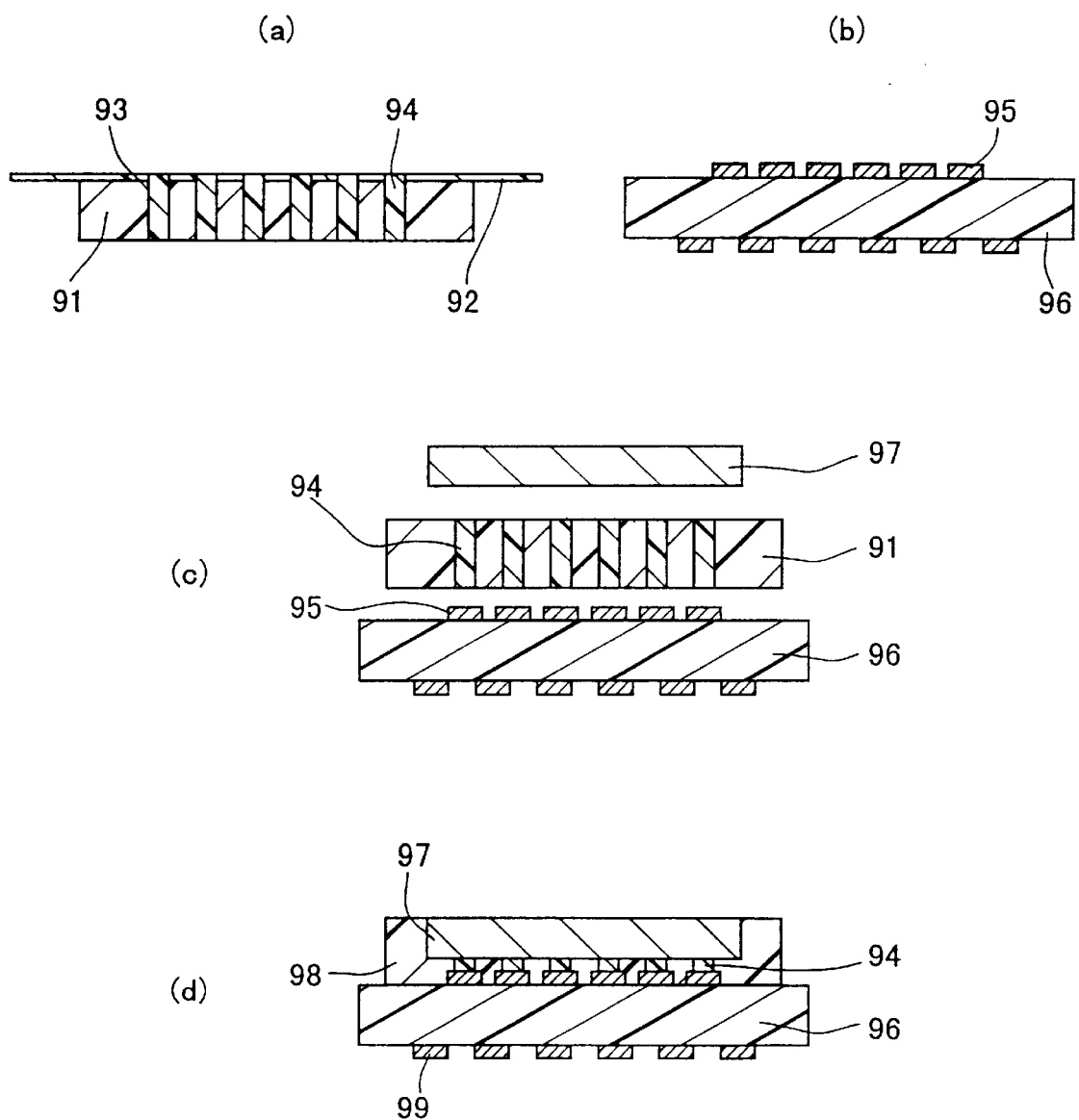
FIGS. 9(a)–(d) are cross-sectional views showing another process for manufacturing a semiconductor package of the present invention.
Figure 10:
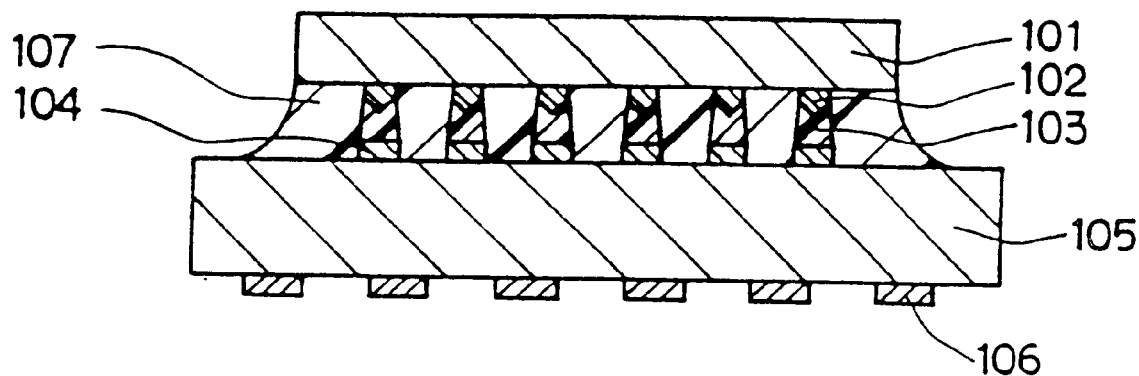
FIG. 10 is a cross-sectional view showing the configuration of a conventional semiconductor package.

FIGS. 9(a)–(d) are cross-sectional views showing another process for manufacturing a semiconductor package in the present invention. First, as shown in FIG. 9(a), through-holes 93 are formed in a thermal conductive sheet 91 in which a conductive resin composition 94 is filled by the same procedure as those of FIGS. 3(a), (b) and (c). Further, as shown in FIG. 9(b), a wiring substrate 96 on which the electrode pattern 95 is formed at the outermost layer is prepared. In FIG. 9(a), numeral 92 indicates a mold-releasing film. Glass-epoxy substrate, a ceramic substrate such as alumina and AlN, and a glass-ceramic low temperature sintering substrate may be used as the wiring substrate 96. Particularly, a substrate having a thermal conductive mixture as a main component is preferable, because the thermal expansion coefficient of the substrate becomes almost the same as that of a thermal conductive mixture that is the post-cured thermal conductive sheet 91, and thereby reliability increases. Further, the bonding property improves because the material of the substrate and the thermal conductive mixture is same. Next, as shown in FIG. 9(c), the thermal conductive sheet 91 and the semiconductor chip 97 are overlapped to match positions of the through-holes 93 formed in the thermal conductive sheet 91 with those of electrodes formed on the semiconductor chip 97. The thermal conductive sheet 91 and the wiring substrate 96 are overlapped to match positions of the through-holes 93 formed in the thermal conductive sheet 91 with those of the electrode pattern 95 formed on the wiring substrate 96. Next, as shown in FIG. 9(d), the thermal conductive sheet 91, the semiconductor chip 97 and the wiring substrate 96 are compressed while being heated and the thermal conductive sheet 91 is cured and integrated with the semiconductor chip 97 and the wiring substrate 96. A process for heat-pressing is conducted by using a die, and the thermosetting resin composition contained in the thermal conductive sheet 91 softens once and then cures. Consequently, a thermal conductive mixture 98 that is the post-cured thermal conductive sheet 91 is bonded to an electrode surface of the semiconductor chip 97 where electrodes are formed and to edge surfaces of the semiconductor chip that adjoin the electrode surface, and the wiring substrate 96 is bonded to the rear face of the thermal conductive sheet 91. In this case, the electrodes formed on the semiconductor chip 97 and the electrode pattern 95 formed on the wiring substrate 96 connect electrically via the conductive resin composition 94. According to the above-mentioned procedures, a semiconductor package is obtained.

When a semiconductor package is manufactured according to the above-mentioned method, the spacing between external lead electrodes 99 that connect with the outside can be made larger than the spacing between electrodes formed on a semiconductor chip 97 by using a wiring substrate 96, and therefore it becomes easier to mount a semiconductor package on a circuit board. Further, it becomes possible to relocate electrodes by using a wiring substrate 96, and therefore it becomes easier to design a circuit board on which a semiconductor package is mounted, and the scope of possible application can be enlarged.

In this case, a semiconductor chip 97 may be connected electrically with external lead electrodes 99 by using a method explained in the FIG. 3, but a method for connecting the semiconductor chip 97 with an electrode pattern 95 formed on the wiring substrate 96 is not limited thereto. For example, the same effect can be obtained by the method explained in the FIGS. 4, 7 and 8.

Further, in the above-mentioned method for manufacturing a semiconductor package, an example in which a semiconductor package is manufactured by using one semiconductor chip was explained, however, a semiconductor package may be manufactured by the following method. That is, first, a plurality of semiconductor chips are prepared and a thermal conductive sheet is processed as required for the plurality of semiconductor chips and then the plurality of semiconductor chips are overlapped on the thermal conductive sheet. Next, the thermal conductive sheet and the plurality of semiconductor chips are compressed while being heated. Consequently, the thermal conductive sheet is cured and integrated with the plurality of semiconductor chips. Next, external lead electrodes are formed. Finally, the plurality of the semiconductor packages that are integrated are divided into individual semiconductor packages. According to the above-mentioned method, many semiconductor packages can be obtained by one operation.

In the above-mentioned method for manufacturing a semiconductor package, it is preferable that the temperature in a process for heat-pressing is in a range between 170 and 260° C. When the temperature is too low, a thermosetting resin composition is not cured sufficiently, and when the temperature is too high, a thermosetting resin composition begins to decompose. Further, it is preferable that the pressure in a process for heat-pressing is in a range between 1–20 MPa.

EXAMPLE

Hereinafter, the details of the present invention will be explained concretely referring to the following non-limiting examples.

A First Example

In forming a thermal conductive sheet as a main component of this invention, inorganic filler, a thermosetting resin composition and a solvent were mixed and alumina balls facilitating the mixing operation were added to the mixture to be dispersed uniformly to obtain slurry. The composition of the thermal conductive sheet formed in this example will be shown in following Table 1.

TABLE 1

| Test No. | Inorganic filler | | Thermosetting resin (inlcuding a curing agent) | | Solvent having a b.p. 150° C. or higher | |
|---|---|---|---|---|---|---|
| | Name | Wt % | Name | Wt % | Name | Wt % |
| 1a | Al$_2$O$_3$ | 60 | Epoxy resin | 36 | Butyl carbitol acetate (BCA) | 4 |
| 1b | | 70 | | 28 | | 2 |
| 1c | | 80 | | 18 | | 2 |
| 1d | | 90 | | 9.5 | | 0.5 |
| 1e | | 95 | | 4.9 | | 0.1 |

In this example, AL-33 (trade name) (and having an average particle diameter of 12 μm manufactured by SUMITOMO KAGAKU Co., Ltd.) was used as Al$_2$O$_3$, NVR-1010 (trade name) (manufactured by JAPAN REC CO., Ltd. and including a curing agent) was used as epoxy resin, and butyl carbitol acetate (manufactured by KANTO KAGAKU Co., Ltd. and having a boiling point 240° C.) was used as a solvent having a boiling point 150° C. or higher.

First, the composition shown in the Table 1 was weighed, methyl ethyl ketone (MEK, having a boiling point 79.6° C., manufactured by KANTO KAGAKU Co., Ltd.) solvent was added so that the slurry viscosity becomes 20 Pa·s, the alumina balls were added and then the mixture was put in a pot and mixed by rotating at 500 rpm for 48 hours. In this case, MEK was used to control the viscosity and is an important element in adding inorganic filler with high density. However, the MEK will evaporate in the following step of drying and will not remain in resin composition. Therefore it was not included in the composition shown in the Table 1.

Next, polyethylene terephthalate (PET) film having a thickness of 75 μm was prepared as a mold-releasing film, the slurry was formed on mold-releasing film by doctor blade method with a blade gap (the gap between a blade and a mold-releasing film) of 1.4 mm. Next, the slurry was allowed to stand for one hour at 100° C. to evaporate the MEK solvent contained in the slurry. As a result, a thermal conductive sheet having flexibility (about 750 μm in thickness) was obtained.

The thermal conductive sheet with the mold-releasing film (inorganic filler: 90 weight parts) obtained by the above-mentioned process was numbered as 1d and was cut into a predetermined size. Through-holes having a diameter of 150 μm were formed in the thermal conductive sheet with a pitch of 250 μm, matching positions of electrodes formed on a semiconductor chip. The process for forming through-holes in the thermal conductive sheet was conducted by using carbon dioxide laser and from a side of the mold-releasing film.

A paste (a conductive resin composition) including spherical copper powder: 85 weight parts, epoxy resin of bisphenol A (EPICOAT 828 (trade name) produced by YUKA SHELL EPOXY Co., Ltd.): 3 weight parts as resin composition, glycidyl ester based epoxy resin (YD-171 (trade name) produced by TOTO KASEI Co., Ltd.): 9 weight parts and amine adduct curing resin (MY-24 (trade name) produced by AJINOMOTO Co., Ltd.): 3 weight parts as curing agent that were compounded by using three rolls was filled in the through-holes by a screen printing method.

Next, the PET film was peeled from the thermal conductive sheet having through-holes in which the paste was filled. A square semiconductor chip (10 mm×10 mm) was overlapped on one side of the thermal conductive sheet to match positions of electrodes formed on the semiconductor chip with those of the through-holes formed in the thermal conductive sheet. Copper foil having a thickness of 35 μm and one side that is roughened was overlapped with the other side of the thermal conductive sheet facing the roughened side of the copper foil.

Next, the obtained thermal conductive sheet, the semiconductor chip and the copper foil was put into a die so as to have an uniform thickness and was compressed while being heated by using a thermal press at 175° C. and at 3 MPa for one hour. As a result, the thermal conductive sheet was cured and integrated with the semiconductor chip and the copper foil.

In this case, the thermosetting resin composition contained in the thermal conductive sheet softens once and then cures. Consequently, a thermal conductive mixture that is the post-cured thermal conductive sheet was bonded to an electrode surface of the semiconductor chip where electrodes are formed and to edge surfaces of the semiconductor chip that adjoin the electrode surface, and the thermal conductive mixture (the thermal conductive sheet) is integrated with the semiconductor chip firmly. Further, the thermal conductive mixture that is the post-cured thermal conductive sheet was bonded firmly to the roughened surface of the copper foil. Further, the epoxy resin contained in the conductive resin composition (paste) was cured, and the copper foil was connected with the semiconductor mechanically and electrically.

Finally, the copper foil was patterned by etching to form external lead electrodes. According to the above-mentioned processes, a semiconductor package shown in FIG. 1 was obtained.

A reflow test was conducted at the temperature as high as 260° C. for ten seconds for twenty times to evaluate the reliability of the obtained semiconductor package. In this case, no particular abnormality was observed in the interface of the semiconductor chip and the semiconductor package, and it was confirmed that the semiconductor chip and the semiconductor package bond firmly. Further, when the change of the electrical resistance value of the semiconductor package including a part connecting the semiconductor chip and the external lead electrodes was measured, it was observed that the initial connecting resistance prior to the reflow test was 35 mΩ/via. However, the connecting resistance after the reflow test was 40 mΩ/via and that is, the connecting resistance changed only very slightly.

As a comparative example, a semiconductor package including a glass-epoxy substrate on which a semiconductor chip was mounted via a solder bump and sealing resin was manufactured. In this semiconductor package, the thermal expansion coefficient of the semiconductor chip was different from that of the substrate and the resistance value increased in the part connecting the semiconductor chip and the substrate. Consequently, disconnection occurred after the reflow test was conducted for ten times. On the contrary, in the semiconductor package in this example, the thermal expansion coefficient in the in-plane direction of the thermal conductive mixture as a substrate was almost the same as that of the semiconductor chip, and the change of the resistance value caused by the reflow test was very slight.

Further, when a determined current is passed in the semiconductor chip to generate 1 W of heat continuously, no change of the appearance of the semiconductor package was observed, and the electrical resistance value of the semiconductor package including a part connecting the semiconductor chip and the external lead electrodes changed only very slightly.

Next, to evaluate the basic property of a thermal conductive mixture, the thermal conductive sheet including the composition as shown in the Table 1 was peeled from the mold-releasing film and was sandwiched by the heat-resistant mold-releasing films (polyphenylene sulphite: PPS, a thickness of 75 μm) again, and was cured at 200° C. and at 5 MPa. After that, the PPS mold-releasing films were peeled from the thermal conductive sheet and processed to a determined size, and properties such as thermal conductivity, thermal expansion coefficient and withstand voltage were measured. The results are shown in Table 2.

TABLE 2

| Test No. | Thermal conductivity (W/m · K) | Thermal expansion coefficient (ppm/° C.) | Withstand voltage (kV/mm) |
| --- | --- | --- | --- |
| 1a | 1.1 | 28 | 15 |
| 1b | 1.2 | 24 | 14 |
| 1c | 1.9 | 18 | 15 |
| 1d | 3.5 | 10 | 12 |
| 1e | 4.1 | 8 | 9 |

In this evaluation, the thermal conductivity was measured by contacting a surface of a specimen that was cut to a square (10 mm×10 mm) with a thermal heater and measuring the temperature increase at the other side of the specimen. Further, the withstand voltage in the Table 2 was obtained by converting AC withstand voltage of the thermal conductive mixture in the direction of thickness to AC withstand voltage per unit thickness. The withstand voltage is affected by the adhesiveness between thermosetting resin composition and inorganic filler contained in a thermal conductive mixture. That is, when a wetting property between inorganic filler and a thermosetting resin composition is poor, a minute gap is generated, and as a result, the strength of the thermal conductive mixture and the withstand voltage lower. In general, the withstand voltage of resin itself is about 15 kV/mm, and when a thermal conductive mixture has the withstand voltage of 10 kV/mm or higher, it is judged that a thermosetting resin composition and the inorganic filler contained in the thermal conductive mixture bond preferably.

According to the results shown in the Table 2, it was found that the thermal conductive mixture manufactured by using the thermal conductive sheet that was obtained according to the above-mentioned method has the thermal conductivity that is more than twenty times than that of a conventional glass-epoxy substrate. Further, a thermal conductive mixture including more than 90 weight parts of $Al_2O_3$ has almost the same thermal expansion coefficient as that of silicon. According to the above-mentioned, the thermal conductive mixture manufactured by using the thermal conductive sheet that was obtained according to the above-mentioned method is suitable for a package on which a semiconductor chip is mounted directly.

A Second Example

Another example of a semiconductor package in which a semiconductor chip is integrated by using the thermal conductive sheet that was manufactured according to the same method as that of the first example and without using a conductive resin composition will be explained. Hereinafter, the composition of the thermal conductive sheet used in this example will be shown.

(1) inorganic filler: $Al_2O_3$ ("AS-40" (trade name) manufactured by SHOWA DENKO Co., Ltd., having a spherical shape and an average particle diameter of 12 μm), 90 weight parts (2) thermosetting resin: cyanate ester resin ("AroCyM30" (trade name) manufactured by ASAHI CIBA Co., Ltd.), 9 weight parts (3) solvent: butyl carbitol (manufactured by KANTO KAGAKU Co., Ltd. and having a boiling point 228° C.), 0.5 weight parts (4) other additive: carbon black (manufactured by TOYO CARBON Co., Ltd.), 0.3 weight parts, dispersing agent ("PRYSURF A208F" (trade name) manufactured by DAIICHI KOGYO SEIYAKU Co., Ltd.) 0.2 weight parts First, using a wire-bonding method, Au bumps were formed on electrodes formed on a square semiconductor chip (10 mm×10 mm). Next, the semiconductor chip was overlapped on a thermal conductive sheet (having a thickness of 550 μm) that was manufactured by using the above-mentioned composition. Then, an external electrode pattern composed of copper foil having a thickness of 35 μm and one side that was roughened was manufactured by etching on a mold-releasing PPS film. Then, the external electrode pattern was overlapped on the other side of the thermal conductive sheet to match a position of the external electrode pattern with a position of the electrode formed on the semiconductor chip. Next, the obtained thermal conductive sheet, the semiconductor chip and the external electrode pattern were put in a die so as to have an uniform thickness, and were pressed while being heated by using a thermal press at 180° C. and at 5 Mpa for one hour. As a result, the thermal conductive sheet was cured and integrated with the semiconductor chip and the external electrode pattern (the external lead electrodes). Finally, the mold-releasing film was peeled from the external electrode pattern, and a semiconductor package as a final product was obtained.

The conductivity of the semiconductor chip and the external lead electrodes was confirmed, and it was found that almost all the electrodes have the conductivity, and that the semiconductor chip and the external lead electrodes were connected preferably.

A reflow test was conducted for twenty times at a temperature as high as 260° C. for ten seconds to evaluate the reliability of the obtained semiconductor package. In this case, no particular abnormality was observed in the interface of the semiconductor chip and the semiconductor package, and it was confirmed that the semiconductor chip and the semiconductor package bond firmly. Further, it was also confirmed that the electrical connection did not change and disconnection between the semiconductor chip and the external lead electrodes did not occur.

A Third Example

Another example of a semiconductor package in which a semiconductor chip is integrated by using the thermal conductive sheet that was manufactured according to the same method as that of the first example will be explained. Hereinafter, the composition of the thermal conductive sheet used in this example will be shown.

(1) inorganic filler: $Al_2O_3$ ("AM-28"(trade name) manufactured by SUMITOMO KAGAGU Co., Ltd., having a spherical shape and an average particle diameter of 12 μm), 87 weight parts (2) thermosetting resin phenol resin ("FENOLIGHT, VH-4150"(trade name) manufactured by DAINIPPON INK AND CHEMICALS Co., Ltd.), 11 weight parts (3) solvent: ethyl carbitol (manufactured by KANTO KAGAKU Co., Ltd. and having a boiling point 202° C.), 1.5 weight parts (4) other additive: carbon black (manufactured by TOYO CARBON Co., Ltd.), 0.3 weight parts, coupling agent ("PLAIN ACT KR-55" (trade name) manufactured by AJINOMOTO Co., Ltd.) 0.2 weight parts First, a thermal conductive sheet that was manufactured by using the above-mentioned composition (having a thickness of 600 gm) was cut into a predetermined size, and through-holes were formed in the thermal conductive sheet in the same manner as that of the method used in the first example. Next, a bump was formed on a semiconductor chip in the same manner as that of the method used in the second example. Then, the semiconductor chip with the bump was overlapped on the thermal conductive sheet to match the positions of the bump formed on the semiconductor chip with those of the through-holes formed in the thermal conductive sheet. A glass-alumina low temperature sintering substrate (having four wiring layers and a thickness of 0.4 mm) having electrodes that were formed opposing to through-holes was overlapped on the other side of the thermal conductive sheet to match the positions of the electrodes formed on the substrate with those of the through-holes formed in the thermal conductive sheet. Next, the obtained thermal conductive sheet, the semiconductor chip and the glass-alumina substrate were put in a die so as to have an uniform thickness, and were pressed while being heated by using a thermal press at 180° C. and at 5 MPa for one hour. As a result, the thermal conductive sheet was cured and integrated with the semiconductor chip and the glass-alumina low temperature sintering substrate. According to the above-mentioned processes, a semiconductor package was obtained.

The conductivity of the semiconductor chip and the external lead electrodes was confirmed, and it was confirmed that almost all the electrodes have the conductivity, and that the semiconductor chip and the external lead electrodes were connected preferably.

A reflow test was conducted for twenty times at the temperature as high as 260° C. for ten seconds to evaluate the reliability of the obtained semiconductor package. In this case, no particular abnormality was observed in the interface of the semiconductor chip and the thermal conductive mixture, and it was confirmed that the semiconductor chip and the thermal conductive mixture bond firmly. Further, it was also confirmed that the electrical connection did not change and disconnection between the semiconductor chip and the external lead electrodes did not occur.

A Fourth Example

Another example of a semiconductor package in which a semiconductor chip is integrated by using the thermal conductive sheet that was manufactured according to the same method as that of the first example will be explained. Hereinafter, the composition of the thermal conductive sheet used in this example will be shown.

(1) inorganic filler: $Al_2O_3$ ("AS-40"(trade name) manufactured by SHOWA DENKO Co., Ltd., having a spherical shape and an average particle diameter of 12 μm), 89 weight parts (2) thermosetting resin: brominated epoxy resin ("EF-134" (trade name) manufactured by JAPAN REC Co., Ltd.), 10 weight parts (3) other additive: carbon black (manufactured by TOYO CARBON Co., Ltd.), 0.4 weight parts, coupling agent ("PLAIN ACT KR-46B" (trade name) manufactured by AJINOMOTO Co., Ltd.) 0.6 weight parts First, a thermal conductive sheet that was manufactured by using the above-mentioned composition (having a thickness of 700 μm) was formed on a PET film and was cut into a predetermined size. Next, through-holes were formed in the thermal conductive sheet in the same manner as that of the method used in the first example, matching electrodes formed on nine semiconductor chips that are arranged in a grid. Then, the through-holes were filled with the same conductive resin composition (paste) in the same manner as that of the method used in the first example. Next, the PET film was peeled from the thermal conductive sheet having through-holes that were filled with the paste. Then, the nine square semiconductor chips (10 mm×10 mm) were overlapped on the thermal conductive sheet in a grid. Copper foil having a thickness of 35 μm and one side that is roughened was overlapped with the other side of the thermal conductive sheet facing the roughened side of the copper foil. Next, the obtained thermal conductive sheet, the semiconductor chip and the copper foil were put in a die so as to have an uniform thickness, and were pressed while being heated by using a thermal press at 175° C. and at 3 MPa for one hour. As a result, the thermal conductive sheet was cured and integrated with the semiconductor chip and the copper foil. Then, the copper foil was patterned by etching to form external lead electrodes. Finally, a plurality of integrated semiconductor packages were cut into individual semiconductor packages with a diamond rotary cutter.

No difference of the appearance between these semiconductor packages and that of the semiconductor package manufactured in the first example was observed. A reflow test was conducted for twenty times at the temperature as high as 260° C. for ten seconds to evaluate the reliability. In this case, no particular abnormality in the appearance of the semiconductor package was observed, and it was confirmed that the difference of the electrical resistance value before and after the reflow test was very slight.

In the first and fourth examples, copper powder was used as conductive filler contained in the conductive resin composition, but it is not limited thereto. Other metallic powder such as gold, silver, palladium or nickel may be used. Particularly, when silver or nickel is used, the electrical conductivity of a conductive part can be maintained at a high level.

The present invention may be embodied in other specific forms without departing from the spirit or essential characteristics thereof. The embodiments disclosed in this application are to be considered in all respects as illustrative and not restrictive, the scope of the present invention being indicated by the appended claims rather than by the foregoing description, all changes that come within the meaning and range of equivalency of the claims are intended to be embraced therein.

What is claimed is:

1. A method for manufacturing a semiconductor package comprising:
    overlapping a semiconductor chip, comprising an electrode surface with at least one electrode disposed thereon and edge surfaces that adjoin the electrode surface, in a face down orientation on a thermal conductive sheet comprising at least 70–95 weight parts of inorganic filler and 5–30 weight parts of thermosetting resin composition and having flexibility in an uncured state,
    compressing the semiconductor chip and the thermal conductive sheet while being heated to bond the thermal conductive sheet to the electrode surface and the edge surfaces, and to cure the thermosetting resin; and
    connecting electrically the at least one electrode with an external lead electrode.

2. The method for manufacturing a semiconductor package according to claim 1, wherein the heating temperature is in a range between 170–260° C.

3. The method for manufacturing a semiconductor package according to claim 1, wherein the compressing is carried out in a range between 1–20 MPa.

4. The method for manufacturing a semiconductor package according to claim 1, further comprising forming a through-hole in the thermal conductive sheet, and overlapping the semiconductor chip on the thermal conductive sheet as to contact the at least one electrode with the through hole.

5. The method for manufacturing a semiconductor package according to claim 4, wherein the through-hole is formed by laser processing, drilling or punching.

6. The method for manufacturing a semiconductor package according to claim 4, further comprising filling a conductive resin composition in the through-hole after forming the through-hole.

7. The method for manufacturing a semiconductor package according to claim 6, wherein the conductive resin composition is filled in only one part of the through-hole facing an opening at one side and the conductive resin composition is not filled in another part of the through-hole facing another side.

8. The method for manufacturing a semiconductor package according to claim 6, wherein the conductive resin composition comprises thermosetting resin, a curing agent and at least one kind of metallic powder selected from a group consisting of gold, silver, copper, palladium and nickel.

9. The method for manufacturing a semiconductor package according to claim 1, wherein a plurality of semiconductor chips are overlapped on a thermal conductive sheet with face down and the plurality of semiconductor chips and an external lead electrode are formed integrally, and the plurality of semiconductor chips, the thermal conductive sheet and the external lead electrode that are formed integrally are divided into individual semiconductor packages.

10. The method for manufacturing a semiconductor package according to claim 1, wherein the at least one electrode comprises a bump.

11. The method for manufacturing a semiconductor package according to claim 10, wherein the bump penetrates into the thermal conductive sheet to connect electrically with the external lead electrode.

12. The method for manufacturing a semiconductor package according to claim 1, wherein the external lead electrode is forming by overlapping a metallic foil on a surface of a thermal conductive sheet that is opposite to a surface on which a semiconductor chip is overlapped, and patterning the metallic foil in a desirable shape to form the external lead electrode.

13. The method for manufacturing a semiconductor package according to claim 1, wherein the external lead electrode is forming by transferring an electrode pattern that is patterned in a desired shape to a surface of a thermal conductive sheet at a side opposite to the surface on which a semiconductor chip is overlapped to form the external lead electrode.

14. The method for manufacturing a semiconductor package according to claim 1, wherein the external lead electrode is forming by bonding a wiring substrate having a surface patterned in a desired electrode shape to a surface of a thermal conductive sheet at a side opposite to the surface on which a semiconductor chip is overlapped to form the external lead electrode.

15. The method for manufacturing a semiconductor package according to claim 1, wherein the inorganic filler includes at least one selected from a group consisting of $Al_2O_3$, MgO, BN and AlN.

16. The method for manufacturing a semiconductor package according to claim 1, wherein the inorganic filler has a particle diameter in a range between 0.1–100 μm.

17. The method for manufacturing a semiconductor package according to claim 1, wherein the thermosetting resin composition comprises as a main component at least one resin selected from a group consisting of epoxy resin, phenol resin and cyanate resin.

18. The method for manufacturing a semiconductor package according to claim 1, wherein the thermosetting resin composition comprises brominated multi-functional epoxy resin as a main component and further includes novolak resin of bisphenol A as a curing agent and imidazole as a curing promoter.

19. The method for manufacturing a semiconductor package according to claim 1, wherein the thermo conductive sheet comprises at least one selected from a group consisting of a coupling agent, a dispersing agent, a coloring agent and a mold-releasing agent.

* * * * *